(12) United States Patent
Wang et al.

(10) Patent No.: US 11,637,407 B2
(45) Date of Patent: Apr. 25, 2023

(54) WELDING SYSTEM

(71) Applicants: Tyco Electronics (Shanghai) Co. Ltd., Shanghai (CN); TE Connectivity Corporation, Berwyn, PA (US)

(72) Inventors: Changjun Wang, Shanghai (CN); Dandan Zhang, Shanghai (CN); Roberto Francisco-Yi Lu, Bellevue, WA (US); Lvhai Hu, Shanghai (CN); Yun Liu, Shanghai (CN); Fengchun Xie, Shanghai (CN)

(73) Assignees: TE Connectivity Solutions GmbH, Schaffhausen (CH); Tyco Electronics (Shanghai) Co. Ltd., Shanghai (CN)

( * ) Notice: Subject to any disclaimer, the term of this patent is extended or adjusted under 35 U.S.C. 154(b) by 850 days.

(21) Appl. No.: 16/532,889

(22) Filed: Aug. 6, 2019

(65) Prior Publication Data
US 2020/0052451 A1 Feb. 13, 2020

(30) Foreign Application Priority Data

Aug. 7, 2018 (CN) .......................... 201810889912.7

(51) Int. Cl.
| | |
|---|---|
| *B23K 3/06* | (2006.01) |
| *B23K 37/02* | (2006.01) |
| *H01R 43/02* | (2006.01) |
| *B23K 1/00* | (2006.01) |
| *B23K 3/04* | (2006.01) |
| *H05K 3/32* | (2006.01) |
| *B23K 101/42* | (2006.01) |

(52) U.S. Cl.
CPC ....... *H01R 43/0256* (2013.01); *B23K 1/0016* (2013.01); *B23K 3/04* (2013.01); *B23K 3/0607* (2013.01); *B23K 37/0229* (2013.01); *B23K 37/0258* (2013.01); *H01R 43/0263* (2013.01); *H05K 3/328* (2013.01); *B23K 2101/42* (2018.08); *H05K 2203/0165* (2013.01)

(58) Field of Classification Search
None
See application file for complete search history.

(56) References Cited

U.S. PATENT DOCUMENTS

| | | | | |
|---|---|---|---|---|
| 2,654,015 A | * | 9/1953 | Landis | .................. B23K 9/188 |
| | | | | 219/73 |
| 4,339,651 A | * | 7/1982 | Kraus | ................ B23K 11/3009 |
| | | | | 228/208 |

(Continued)

*Primary Examiner* — Devang R Patel
(74) *Attorney, Agent, or Firm* — Barley Snyder

(57) ABSTRACT

A welding system comprises a welding module and a moving module adapted to move the welding module to a predetermined welding position. The welding module includes a guiding device and a welding tool. The guiding device has a plurality of tubular guiding heads arranged in a row, ends of the plurality of tubular guiding heads are disposed close to joints of a plurality of cables so as to guide a plurality of welding wires to the joints of the plurality of cables. The welding tool has a plurality of tooth-shaped welding heads arranged in a row, ends of the plurality of tooth-shaped welding heads are disposed close to the joints of the plurality of cables and configured to simultaneously heat the plurality of welding wires guided to the joints of the plurality of cables, so as to simultaneously weld the joints of the plurality of cables onto a circuit board.

18 Claims, 3 Drawing Sheets

(56) References Cited

U.S. PATENT DOCUMENTS

| | | | | | |
|---|---|---|---|---|---|
| 4,870,240 | A | * | 9/1989 | Fiedelius | H01R 43/0214 219/56.22 |
| 5,565,119 | A | * | 10/1996 | Behun | B29C 65/245 228/1.1 |
| 9,216,470 | B2 | * | 12/2015 | Berg | B23K 9/125 |
| 2006/0240684 | A1 | * | 10/2006 | Chang | H01R 43/0249 439/59 |
| 2008/0169336 | A1 | * | 7/2008 | Spiegel | B23K 9/0213 228/57 |
| 2013/0186941 | A1 | * | 7/2013 | Nikkhoo | H05K 13/0015 228/180.5 |
| 2014/0076956 | A1 | * | 3/2014 | Lu | B23K 1/0016 228/8 |

\* cited by examiner

WELDING SYSTEM

CROSS-REFERENCE TO RELATED APPLICATION

This application claims the benefit of the filing date under 35 U.S.C. § 119(a)-(d) of Chinese Patent Application No. 201810889912.7, filed on Aug. 7, 2018.

FIELD OF THE INVENTION

The present invention relates to a welding system and, more particularly, to a welding system adapted to weld a cable onto a circuit board.

BACKGROUND

In a welding system, typically only one cable is soldered onto a circuit board at one time. Therefore, when the number of cables to be welded is large, a long welding time is required, and the welding efficiency is very low.

SUMMARY

A welding system comprises a welding module and a moving module adapted to move the welding module to a predetermined welding position. The welding module includes a guiding device and a welding tool. The guiding device has a plurality of tubular guiding heads arranged in a row, ends of the plurality of tubular guiding heads are disposed close to joints of a plurality of cables so as to guide a plurality of welding wires to the joints of the plurality of cables. The welding tool has a plurality of tooth-shaped welding heads arranged in a row, ends of the plurality of tooth-shaped welding heads are disposed close to the joints of the plurality of cables and configured to simultaneously heat the plurality of welding wires guided to the joints of the plurality of cables, so as to simultaneously weld the joints of the plurality of cables onto a circuit board.

BRIEF DESCRIPTION OF THE DRAWINGS

The invention will now be described by way of example with reference to the accompanying Figures, of which.

DETAILED DESCRIPTION OF THE EMBODIMENT(S)

Figure 1:
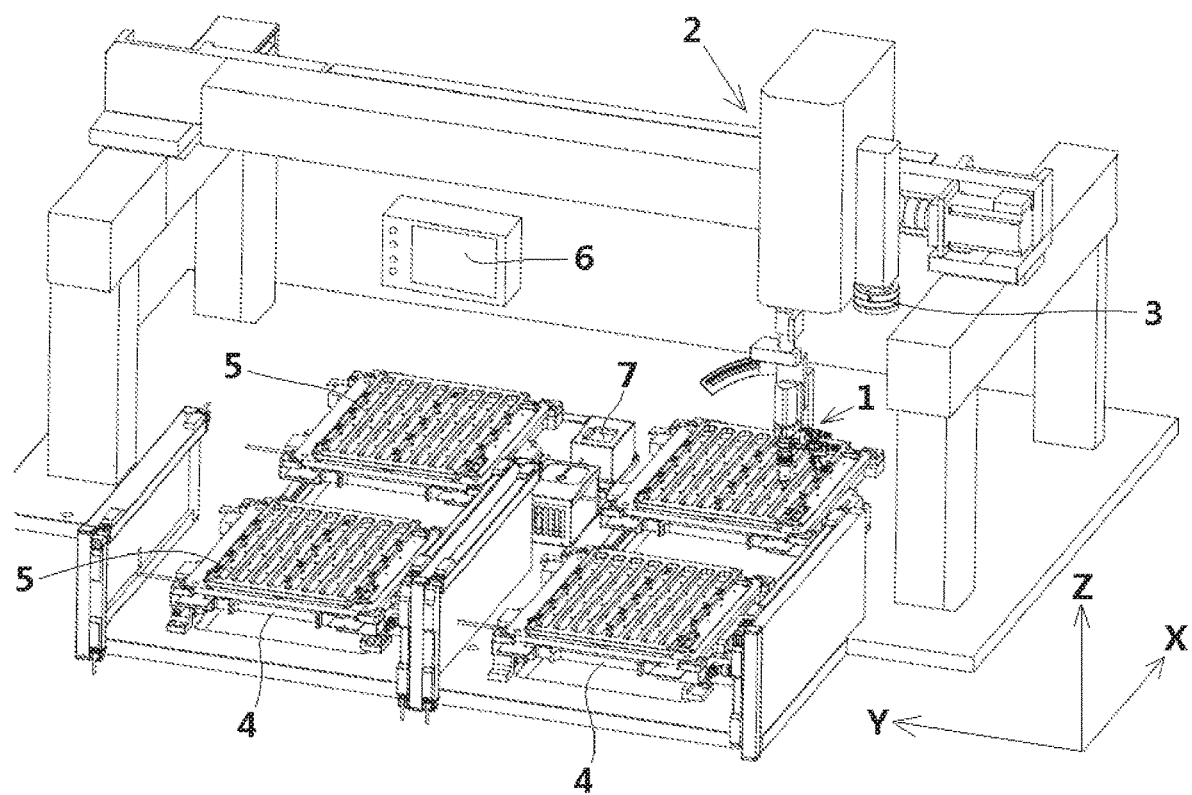
FIG. 1 is a perspective view of a welding system according to an embodiment.

Exemplary embodiments of the present disclosure will be described hereinafter in detail with reference to the attached drawings, wherein like reference numerals refer to like elements. It should be understood that the description of the embodiments of the present disclosure in conjunction with the attached drawings is to convey a general concept of the present disclosure to the person of ordinary skill in the art; the present disclosure is not limited to the described exemplary embodiments.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

A welding system according to an embodiment, as shown in FIG. 1, comprises a welding module 1 and a moving module 2. The welding module 1 is mounted on the moving module 2 and the moving module 2 is adapted to move the welding module 1 to a predetermined welding position.

Figure 2:
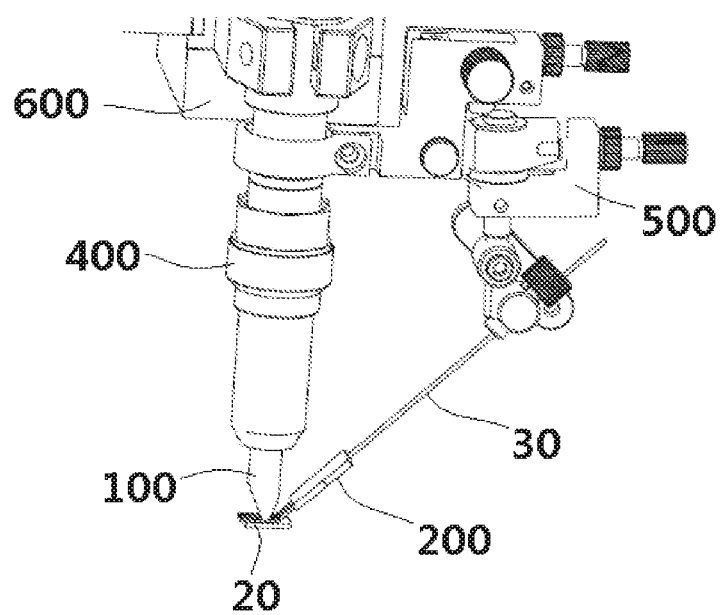
FIG. 2 is a perspective view of a welding module of the welding system.
Figure 3:
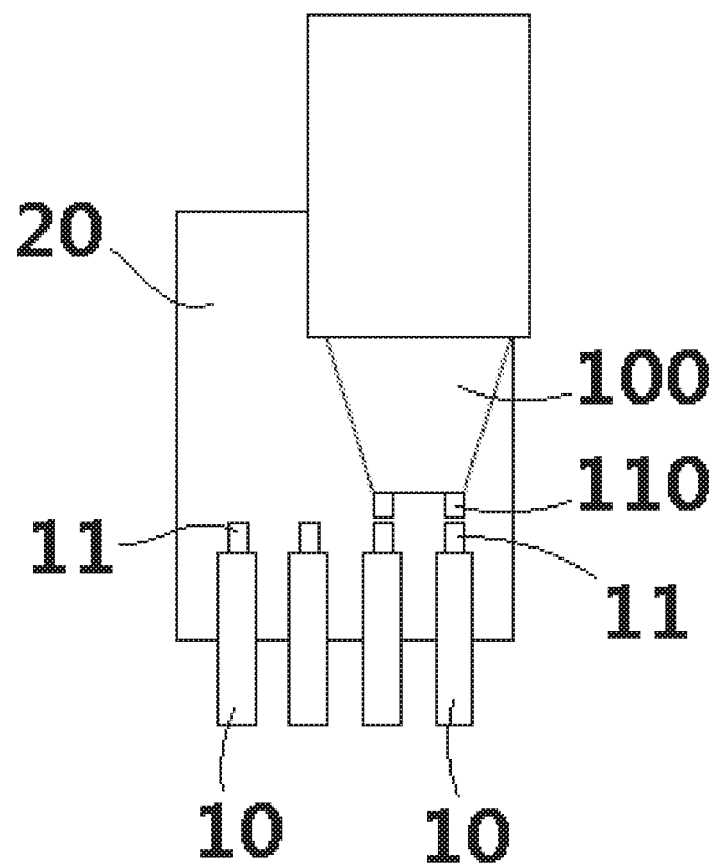
FIG. 3 is a plan view of a welding tool of the welding module and a cable to be soldered onto a circuit board.

As shown in FIG. 2, the welding module 1 includes a welding tool 100 and a guiding device 200. The guiding device 200, as shown in FIGS. 2 and 3, is adapted to guide a welding wire 30 to a joint 11 of a cable 10 to be soldered onto a circuit board 20. The welding tool 100 is adapted to heat the welding wire 30 guided to the joint 11 to melt the welding wire 30 so that the joint 11 of the cable 10 is welded onto the circuit board 20.

Throughout the present specification, the terms "welding", "welded", and "soldering", "soldered" and the like will be used interchangeably and, for the purposes of this disclosure, do not imply different meanings from one another. All terms "welding", "welded", and "soldering", "soldered" and the like indicate in the present disclosure that an element, the welding wire 30, is heated and melted to join two other elements, the joint 11 of the cable 10 and the circuit board 20, as described herein.

Figure 4:
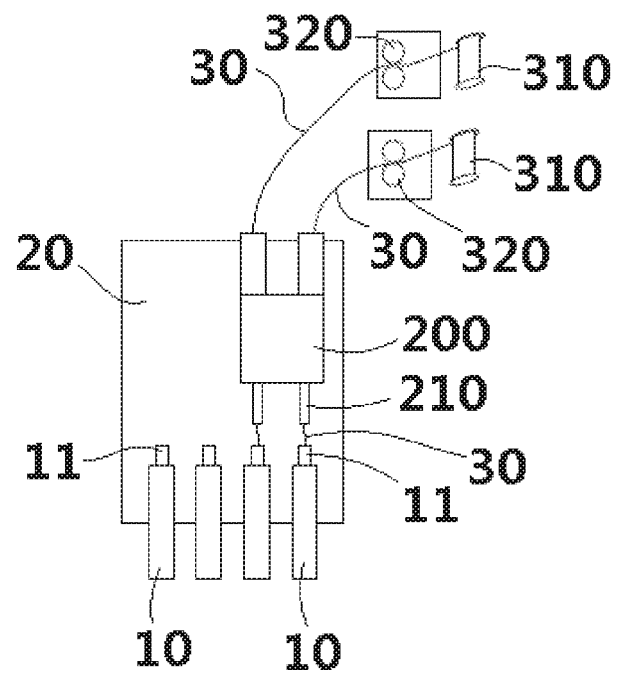
FIG. 4 is a plan view of a guiding device of the welding module and the cable to be soldered onto the circuit board.

As shown in FIGS. 2 and 4, the guiding device 200 has a plurality of tubular guiding heads 210 arranged in a row. Ends of the plurality of tubular guiding heads 210 are disposed respectively close to joints 11 of a plurality of cables 10 so as to guide a plurality of welding wires 30 to the joints 11 of the plurality of cables 10, respectively.

The welding tool 100, as shown in FIG. 3, has a plurality of tooth-shaped welding heads 110 arranged in a row. Ends of the plurality of tooth-shaped welding heads 110 are respectively disposed close to the joints 11 of the plurality of cables 10 and configured to simultaneously heat the plurality of welding wires 30 that have been guided to the joints 11 of the plurality of cables 10 so as to simultaneously weld the joints 11 of the plurality of cables 10 onto the circuit board 20.

As shown in FIG. 4, a gap between two adjacent tubular guiding heads 210 on the guiding device 200 is substantially equal to a gap between the joints 11 of two adjacent cables 10, such that the plurality of tubular guiding heads 210 on the guiding device 200 are aligned with the joints 11 of the plurality of cables 10, respectively. As shown in FIG. 3, a gap between two adjacent tooth-shaped welding heads 110 on the welding tool 100 is substantially equal to a gap between the joints 11 of the two adjacent cables 10 such that the plurality of tooth-shaped welding heads 110 on the welding tool 100 are aligned with the joints 11 of the plurality of cables 10, respectively.

Figure 5:
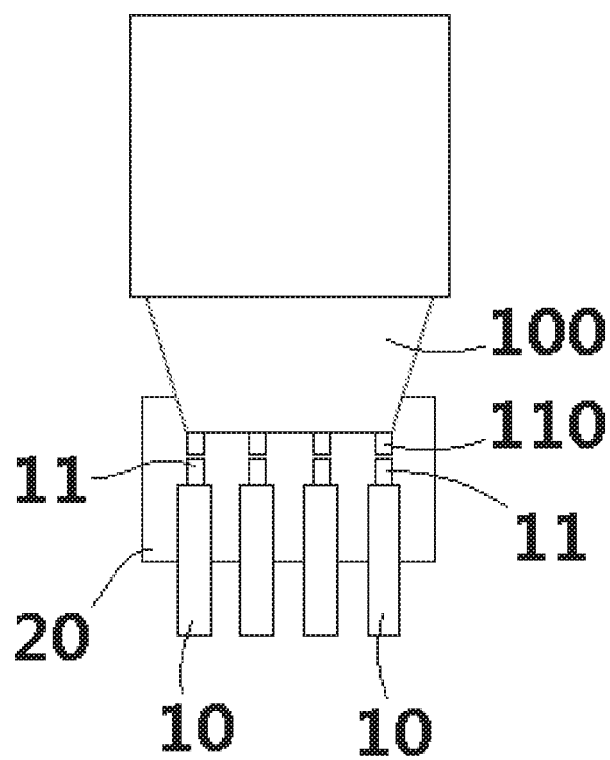
FIG. 5 is a plan view of a welding tool of a welding system according to another embodiment.

In the embodiment shown in FIGS. 3 and 4, two tooth-shaped welding heads 110 are formed on the welding tool 100 and two tubular guiding heads 210 are formed on the guiding device 200. In other embodiments, three or more tooth-shaped welding heads 110 may be formed on the welding tool 100, and similarly, three or more tubular guiding heads 210 may be formed on the guiding device 200. A welding tool 100 according to another embodiment is shown in FIG. 5. In the embodiment shown in FIG. 5, four tooth-shaped welding heads 110 are formed on the welding tool 100. Although not shown, it is appreciated that at least four tubular guiding heads 210 should be formed on the guiding device 200.

As shown in FIG. 4, the welding system further includes a plurality of welding wire conveying devices 310, 320. Each of the welding wire conveying devices 310, 320 is adapted to convey one welding wire 30 into one respective tubular guiding head 210 of the guiding device 200. Each of the welding wire conveying devices 310, 320 includes a rotary drum 310, a pair of clamping rollers 320, and a driving device. The welding wire 30 is wound around the rotary drum 310. The welding wire 30 released from the rotary drum 310 passes between the pair of clamping rollers 320. The pair of clamping rollers 320 is adapted to clamp the welding wire 30 that is loosened and released from the rotary drum 310. The drive device is adapted to drive the pair of clamping rollers 320 to rotate so that the welding wire 30 may be fed forward by the pair of clamping rollers 320.

The welding system, as shown in FIG. 2, further includes a first adjustment device 400 on which the welding tool 100 is mounted. The first adjustment device 400 is configured to perform fine adjustment on a position of the tooth-shaped welding head 110 on the welding tool 100 with respect to the joint 11 of the cable 10. In the shown embodiment, after moving the welding module 1 to the predetermined welding position by the moving module 2, the position of the tooth-shaped welding head 110 on the welding tool 100 with respect to the joint 11 of the cable 10 may be fine-tuned by the first adjustment device 400, so that the tooth-shaped welding head 110 on the welding tool 100 may be in the optimum welding position. In an embodiment, the first adjustment device 400 may comprise a helical adjustment device that is adapted to adjust a height position of the tooth-shaped welding head 110 on the welding tool 100 with respect to the joint 11 of the cable 10.

As shown in FIG. 2, the welding system further includes a second adjustment device 500 on which the guiding device 200 is mounted. The second adjustment device 500 is configured to adjust an angle and a position of the tubular guiding head 210 on the guiding device 200 with respect to the tooth-shaped welding head 110 on the welding tool 100. As shown in FIG. 4, the tubular guiding head 210 on the guiding device 200 should be positioned at a predetermined angle and a predetermined position with respect to the tooth-shaped welding head 110 on the welding tool 100. In this way, the welding accuracy may be improved.

The welding system further includes a mounting bracket 600, as shown in FIG. 2. The first adjustment device 400 and the second adjustment device 500 are mounted on the mounting bracket 600. The mounting bracket 600 is secured onto the moving module 2. The moving module 2 may move the welding module 1 mounted on the mounting bracket 600 to the predetermined welding position by moving the mounting bracket 600.

As shown in FIG. 1, the welding system includes a vision module 3 that is adapted to visually identify the position of the joint 11 of the cable 10. The vision module 3 may include a camera. The moving module 2 is adapted to move the welding module 1 to the predetermined welding position under the visual guidance of the vision module 3. The vision module 3 is mounted on the moving module 2 so as to be movable in synchronization with the mounting bracket 600 and the welding module 1.

The moving module 2, shown in FIG. 1, comprises a translation mechanism, which is moveable in a first horizontal direction X, a second horizontal direction Y perpendicular to the first horizontal direction X, and a vertical direction Z perpendicular to the first horizontal direction X and the second horizontal direction Y. In another embodiment, the moving module 2 comprises a robot having a plurality of degrees of freedom.

The welding system, as shown in FIG. 1, further includes two mobile stations 4 which are arranged side by side in the second horizontal direction Y. Each mobile station 4 is movable in the first horizontal direction X. The cable 10 to be soldered and the circuit board 20 are loaded on the mobile station 4, and the mobile station 4 is adapted to move the cable 10 to be soldered and the circuit board 20 to a welding station. In the shown embodiment, two carriers 5 are mounted on each mobile station 4. Each carrier 5 is adapted to clamp and secure the cable 10 to be soldered and the circuit board 20. Because two carriers 5 are mounted on each mobile station 4, in the case where one of the two carriers 5 is moved to the welding station, the other of the two carriers 5 is moved to a loading and unloading station. In this way, it is possible to ensure that the welding operation and the loading and unloading operation may be performed in synchronization, so that the welding efficiency may be greatly improved.

The welding system, as shown in FIG. 1, further includes a welding parameter controller 6 which is used to set and optimize working parameters of the welding tool 100, so that the working parameters of the welding tool 100 are optimal. For example, the welding parameter controller 6 may adjust the temperature parameter of the welding tool 100.

The welding system, as shown in FIG. 1, further includes a reset controller 7 which is adapted to automatically move the welding module 1 to an initial position by controlling the moving module 2. In this way, cumulative errors generated by the moving module 2 during the movement process may be eliminated, which is beneficial to improve the welding precision.

It should be appreciated for those skilled in this art that the above embodiments are all exemplary embodiments, and many modifications may be made to the above embodiments by those skilled in this art, and various features described in different embodiments may be freely combined with each other without conflicting in configuration or principle.

Although the present disclosure has been described with reference to the attached drawings, the embodiments disclosed in the attached drawings are intended to describe embodiments of the present disclosure exemplarily, but should not be construed as a limitation to the present disclosure.

Although several embodiments of the general concept of the present disclosure have been shown and described, it would be appreciated by those skilled in the art that various changes or modifications may be made in these embodiments without departing from the principles and spirit of the disclosure, the scope of which is defined in the claims and their equivalents.

As used herein, term "comprising" or "having" should be understood as not excluding other elements or steps, and term "a" or "an" should be understood as not excluding plural elements or steps. In addition, any reference numeral in claims should not be understood as the limitation of the scope of the present disclosure.

What is claimed is:
1. A welding system, comprising:
a welding module including:

a guiding device adapted to guide a welding wire to a joint of a cable to be soldered onto a circuit board, the guiding device has a plurality of tubular guiding heads arranged in a row, ends of the plurality of tubular guiding heads are disposed respectively close to joints of a plurality of cables so as to guide a plurality of welding wires to the joints of the plurality of cables, and a welding tool adapted to heat the welding wire guided to the joint to melt the welding wire and weld the joint of the cable onto the circuit board, the welding tool has a plurality of tooth-shaped welding heads arranged in a row, ends of the plurality of tooth-shaped welding heads are disposed respectively close to the joints of the plurality of cables and configured to simultaneously heat the plurality of welding wires guided to the joints of the plurality of cables so as to simultaneously weld the joints of the plurality of cables onto the circuit board;

a moving module adapted to move the welding module to a predetermined welding position;

a first adjustment device on which the welding tool is mounted;

a second adjustment device on which the guiding device is mounted; and a mounting bracket on which the first adjustment device and the second adjustment device are mounted.

2. The welding system of claim 1, wherein a gap between two adjacent tubular guiding heads on the guiding device is substantially equal to a gap between the joints of two adjacent cables, the plurality of tubular guiding heads on the guiding device are aligned with the joints of the plurality of cables.

3. The welding system of claim 1, wherein a gap between two adjacent tooth-shaped welding heads on the welding tool is substantially equal to a gap between the joints of two adjacent cables, the plurality of tooth-shaped welding heads on the welding tool are aligned with the joints of the plurality of cables.

4. The welding system of claim 1, further comprising a plurality of welding wire conveying devices, each of the welding wire conveying devices is adapted to convey one welding wire into one tubular guiding head of the guiding device.

5. The welding system of claim 4, wherein each of the welding wire conveying devices includes a rotary drum around which the one welding wire is wound, a pair of clamping rollers adapted to clamp the one welding wire released from the rotary drum, and a driving device adapted to drive the pair of clamping rollers to rotate such that the one welding wire is fed forward by the pair of clamping rollers.

6. The welding system of claim 1, wherein the first adjustment device is configured to perform a fine adjustment on a position of the tooth-shaped welding heads on the welding tool with respect to the joints of the cables.

7. The welding system of claim 6, wherein the second adjustment device is configured to adjust an angle and a position of the tubular guiding heads on the guiding device with respect to the tooth-shaped welding heads on the welding tool.

8. The welding system of claim 7, wherein the tubular guiding heads on the guiding device are positioned at a predetermined angle and a predetermined position with respect to the tooth-shaped welding heads on the welding tool.

9. The welding system of claim 8, wherein the mounting bracket is secured onto the moving module, and the moving module is configured to move the mounting bracket so as to move the welding module mounted on the mounting bracket to the predetermined welding position.

10. The welding system of claim 9, further comprising a vision module configured to visually identify a position of the joints of the cables.

11. The welding system of claim 10, wherein the moving module is adapted to move the welding module to the predetermined welding position under a visual guidance of the vision module.

12. The welding system of claim 11, wherein the vision module is mounted on the moving module so as to be moveable in synchronization with the mounting bracket.

13. The welding system of claim 1, further comprising a welding parameter controller for setting and optimizing operating parameters of the welding tool.

14. The welding system of claim 1, further comprising a reset controller that is adapted to automatically move the welding module to an initial position by controlling the moving module.

15. A welding system, comprising:
a welding module including:
a guiding device adapted to guide a welding wire to a joint of a cable to be soldered onto a circuit board, the guiding device has a plurality of tubular guiding heads arranged in a row, ends of the plurality of tubular guiding heads are disposed respectively close to joints of a plurality of cables so as to guide a plurality of welding wires to the joints of the plurality of cables, and a welding tool adapted to heat the welding wire guided to the joint to melt the welding wire and weld the joint of the cable onto the circuit board, the welding tool has a plurality of tooth-shaped welding heads arranged in a row, ends of the plurality of tooth-shaped welding heads are disposed respectively close to the joints of the plurality of cables and configured to simultaneously heat the plurality of welding wires guided to the joints of the plurality of cables so as to simultaneously weld the joints of the plurality of cables onto the circuit board;

a moving module adapted to move the welding module to a predetermined welding position, the moving module has a translation mechanism moveable in a first horizontal direction, a second horizontal direction perpendicular to the first horizontal direction, and a vertical direction perpendicular to the first horizontal direction and the second horizontal direction; and a pair of mobile stations arranged side by side in the second horizontal direction, each of the mobile stations is moveable in the first horizontal direction.

16. The welding system of claim 15, wherein the cables and the circuit board are loaded on the mobile stations and the mobile stations are adapted to move the cables and the circuit board to a welding station.

17. The welding system of claim 16, wherein a pair of carriers are mounted on each mobile station, each carrier is adapted to clamp and secure the cables and the circuit board.

18. The welding system of claim 17, wherein if a first of the carriers is moved to the welding station, a second of the carriers is moved to a loading and unloading station.

* * * * *